SEMICONDUCTOR DIODE CONSTRUCTION AND MOUNTING

Filed Sept. 29, 1965 2 Sheets-Sheet 1

Inventor
LARRY L. MESLER
By,
Attorneys

SEMICONDUCTOR DIODE CONSTRUCTION AND MOUNTING

Filed Sept. 29, 1965 2 Sheets-Sheet 2

Inventor
LARRY L. MESLER
By, Alfred H. Rosen
Thomas N. Tarrant
Attorneys

United States Patent Office 3,460,002

Patented Aug. 5, 1969

3,460,002

SEMICONDUCTOR DIODE CONSTRUCTION AND MOUNTING

Larry L. Mesler, Billerica, Mass., assignor to Microwave Associates, Inc., Burlington, Mass., a corporation of Massachusetts Filed Sept. 29, 1965, Ser. No. 491,308
Int. Cl. H01l 9/00, 1/00; H05k 5/02
U.S. Cl. 317—234 3 Claims

ABSTRACT OF THE DISCLOSURE

A semiconductor diode characterized by improved thermal and mechanical properties is disclosed. The diode is housed in a ceramic tube bonded at one end to a thermal sink having a mounting platform extending into the tube and at the other end to a flexible contact arrangement incorporating a rigid envelope member; this arrangement includes a flexible contact inside the housing and a flexible contact outside the housing with the rigid envelope member between them. Thermal shock is minimized by employing low-expansion coefficient metal washers between the ends of the ceramic tube and the adjoining housing members.

This invention relates to the construction and packaging of semiconductor diodes for microwave use.

Semiconductor diodes are used extensively for microwave generation and control. As the frequencies in use extend ever higher, the problems of reliability, stability, efficiency and reproducibility increase.

The present invention defines a microwave diode packaged for simplicity and economy of manufacture and high stability in operation. Simplicity and uniformity in manufacture are obtained by using preformed solder wafers and/or solder-coated surfaces. This avoids multiple handling and multiple heating. The package is assembled from preconstructed units which are joined in one heating step uniting a plurality of solder points. Stability in operation is achieved by fusing a glass ring over the exposed semiconductor and by a ceramic cylinder mounted to a "heat sink" electrode by means of a temperature-expansion compensating seal. Other features of the inventive diode, as will be described below, combine uniquely to provide a significant improvement in the microwave diode art.

Thus, it is an object of the invention to define an improved microwave diode.

It is a further object of the invention to define a novel packaging concept for microwave semiconductor devices.

It is still a further object of the invention to define a new method of manufacture for microwave semiconductor devices.

These and further objects of the invention will become more apparent upon reading the following disclosure, together with the drawings wherein like numbers are used to designate like elements through the figures.

Figure 1:
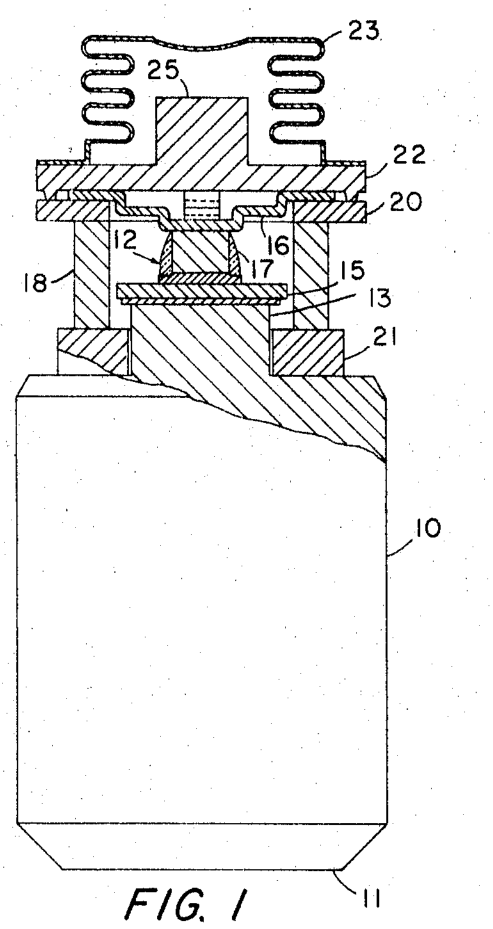
FIGURE 1 is a side view of the inventive diode package partly in section.

A general description of the complete diode package will be given first with reference to FIGURE 1. A heat sink and mounting base 10 is made of a suitable highly conductive metal such as a copper alloy. Base 10 is the electrical connection point for one of the electrodes of the diode. As illustrated, this electrode is the cathode. While base 10 may be solid, it has been found useful to drill a short axial hole from free end 11 which is then internally threaded for ease of making an electrical connection. A semiconductor diode element 12 is mounted on a raised portion 13 of base 10 upon a molybdenum platform 15.

The second electrode of diode element 12 is made by contacting the semiconductor material with a contact strip 16. Between contact strip 16 and molybdenum platform 15, the semiconductor is encapsulated in a glass bead 17. Semiconductor element 12 is further surrounded by a hollow dielectric cylinder 18 supported between contact strip 16 and base 10 by top and bottom washers 20 and 21 of low expansion coefficient metal. The dielectric cylinder is preferably made of a very high resistivity ceramic such as beryllium-oxide ceramic or aluminum oxide ceramic. Various glasses are also suitable. Suitable metals for washers 20 and 21 are nickel-iron alloys. One such alloy consists of 20% nickel, 17% cobalt, 0.2% manganese and the balance iron manufactured by Westinghouse Electric Corporation under the trademark "Kovar." Another such alloy consists of 36% nickel and the balance iron available from Driver-Harris Co. under the trademark "Nilvar." Contact strip 16 is covered by a cap plate 22, which is welded to the top washer 20, which in turn serves for this purpose as a weld flange. A bellows contact 23 is connected to the cap plate 22 to serve as an elastic electrical contact. A raised portion 25 in the center of cap plate 22 acts as a stop for bellows contact 23 to prevent collapsing of the bellows beyond its elasticity limits. In the configuration illustrated, bellows contact 23 is used as the external connection point for the anode. Bellows contact 23 has been made of nickel. However, the material is not critical as long as it has elasticity and a conductive path is provided for electrical contact.

Figure 2:
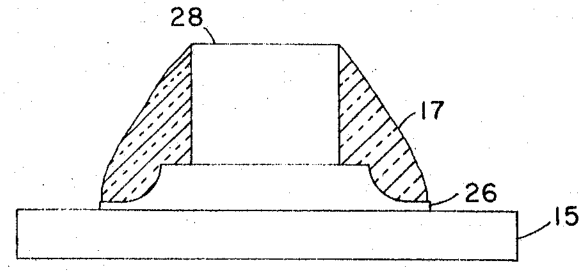
FIGURE 2 is a sectional view of the diode element.

The partially glass-encapsulated diode element is illustrated separately in FIGURE 2. This element consists of a PIN silicon chip 26 mounted between a molybdenum platform 15 and a contact cylinder 28 of metal having a low coefficient of expansion. Molybdenum is used for platform 15 as a compromise between the desirable coefficient of expansion and the necessary electrical and thermal conductive properties. Other materials such as tungsten or a tungsten-silver alloy are also suitable for platform 15. Contact cylinder 28 is selected for the electrical and thermal properties of a solid material. The thermal conductivity and mass are preferably adapted to drain off and briefly store some of the heat developed in the silicon chip during an applied rf pulse. In operation, this heat then dissipates back through the silicon and down through platform 15 between applied pulses. A significant increase in pulse handling capability is achieved in this way. Thus cylinder 28 is suitably made of a nickel-iron alloy, molybdenum or the like.

PIN chip 26, platform 15 and cylinder 28 are preassembled separately. While the diode element itself is described herein as a PIN silicon chip, other semiconductor diode elements can be used in the inventive assembly. A Mesa type or a Planar type diode is suited for mounting between the platform 15 and cylinder 28 as disclosed herein. Silicon chip 26 is first treated by nickel sintering and is then gold plated on its top and bottom surfaces in conventional manner. The surfaces of cylinder 28 and platform 15 to be bonded to chip 26 are first clad with soft solder. This cladding is obtained by mechanically bonding sheet solder composition to the cylinder and platform material as, for example, by rolling.

The clad pieces are then jigged into position above and below silicon chip 26 and enough pressure is applied to hold the assembly firmly together. The assembly is then heated to effect soldering. The heat required depends on the particular solder composition and will generally be in the range of 400 to 500° C. After soldering, the remaining exposed surfaces of silicon chip 26 are etched in conventional manner to removed any contamination. A glass bead 17 is slipped over cylinder 28 and then heated until it flows to form a partial encapsulation covering the sides of PIN chip 26 and cylinder 28. The glass bead is preferably made of a sodium-free glass having a melting point below about 800° C. and is formed under pressure to exclude air bubbles.

By preforming the glass as a head under enough pressure and temperature to exclude substantially all gas, uniformity in manufacture is greatly improved.

Figure 4:
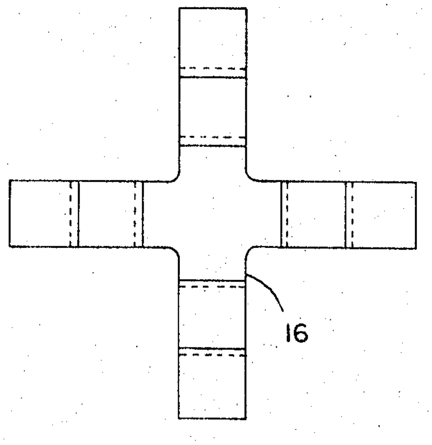
FIGURE 4 is a top view of the strip of FIGURE 3.
Figure 3:
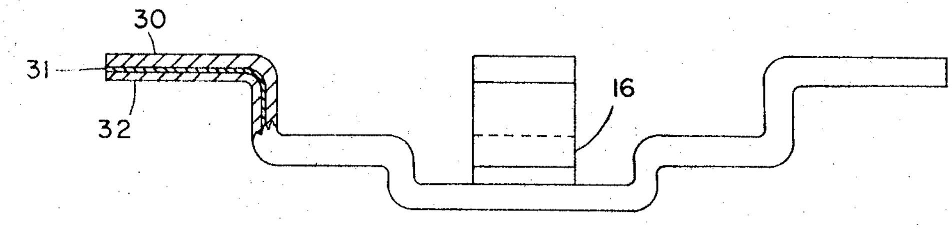
FIGURE 3 is a cross-section of a contact strip for the diode element.

Contact strip 16 is a laminated assembly shown in detail in FIGURES 3–4. The strip is made primarily of copper 30 about .002" thick. Three quarter hard OFHC copper has been found suitable. The copper is clad on one side with a gold layer 31 which in turn is clad with a tin layer 32.

Figure 5:
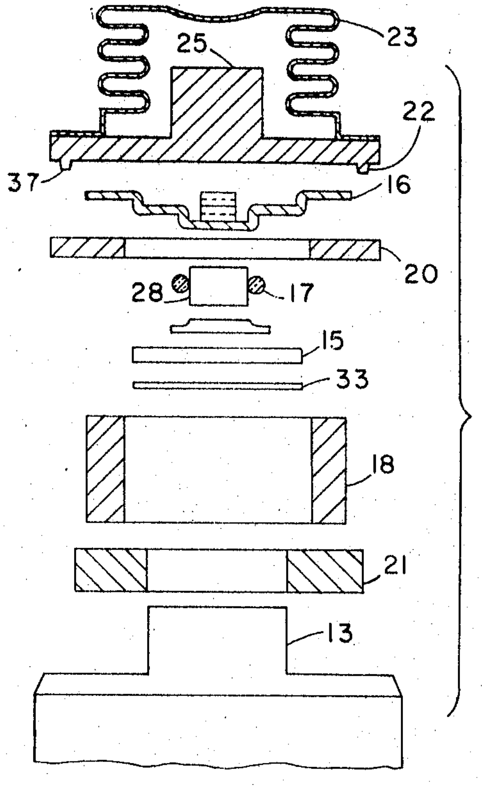
FIGURE 5 is an exploded view showing the assembly of FIGURE 1.

The assembly process is illustrated in exploded view FIGURE 5.

Base 10, hollow ceramic cylinder 18, the bottom or base washer 21 and the weld flange 20 are preassembled before mounting the diode element. In this preassembly, the hollow ceramic cylinder 18 is bonded between base washer 21 and weld flange 20 in a conventional manner and then the base washer 21 is brazed to base 10.

As is conventional in microwave devices, all exposed metal surfaces are gold plated, either before or after assembly, as is convenient. Thus raised portion 13 of base 10 is gold plated. A disc 33 of solder sheet material about .001" thick is positioned between portion 13 of the base and molybdenum platform 15. Next, contact strip 16 is positioned with the center portion resting against cylinder 28 and its outer ends overlying weld flange 20. Contact strip 16 is made of sheet copper 30 coated on one side with a gold-tin solder 31 and 32.

The contact strip is in the form of a crossed multiple leg configuration as is illustrated in FIGURE 4. The use of four legs in the configuration, instead of one or two, reduces the amount of inductance introduced into the assembly, since each leg of the strip acts as an inductor. The additional legs are positioned in parallel with each other lowering the overall inductance. While four legs are illustrated, it is to be understood that any plural number of legs is suitable, with additional legs lowering the overall inductance.

Each leg is stamped out with a plurality of right angle bends as is depicted in FIGURE 3 to reduce the effects of thermal expansion. Thus, any expansion or contraction due to temperature is absorbed by the right angle bends reducing nonuniformity in the operation of the diode under changing temperature conditions.

In assembly, a jig fixture is used to position the diode assembly inside the base assembly and to hold contact strip 16 with center portion pressed firmly against cylinder 28, and the ends of its legs pressed firmly against weld flange 20. The entire assembly is then heated enough to effect soldering, that is in about the range of 400–500° C. In this one step, a solder bond is formed by solder disc 33, between portion 13 on base 10 and platform 15 of the diode assembly; also between cylinder 28 of the diode assembly and the center of contact strip 16, and between the legs of the contact strip 16 and weld flange 20, where these meet. Solder bonds in the latter locations with contact strip 16 are produced from the solder plating on strip 16.

Weld cap 22 is then put in place over contact strip 16 and an electric current is applied between weld flange 20 and weld cap 22.

This electric current causes the temperature at the contact point of weld ridge 37 to rise until the metal flows and fuses forming a hermetic weld seal. This welding is performed in a dry nitrogen atmosphere so that all space inside the assembly is filled with dry nitrogen after welding.

Bellows contact 23 is secured over weld cap 22 by any suitable method, for example spot welding.

The means of bonding one part to another in the present invention have been variously described as soldering and welding. Soldering is intended to include brazing when the higher temperature will not injure the components. The particular mode described in each instance is believed preferable, but is not intended as a limitation. Thus soldering can be used where welding is specified. Strictly mechanical bonding means can be used in some instances.

The semiconductor diode package described is intended for mounting in various ways depending on design consideration. Base 10 is desirably a cylinder adapted for a press-fitting into a microwave assembly structure. Thus it is a feature of the inventive structure that bellows 23, cap 22, washers 20–21, and ceramic cylinder 18 are all relatively small in diameter, with respect to base 10. This permits the diode package to be inserted through a press-fit opening for securing base 10 with the bellows end first. The diode package constructed this way is readily mountable with either end first, as desired.

While the invention has been described in relation to specific embodiments, various modifications thereof will be apparent to those skilled in the art and it is intended to cover the invention broadly within the spirit and scope of the appended claims.

I claim:

1. In a microwave diode assembly comprising a heat-sink base, a metal cap, a hollow dielectric cylinder between said base and said cap, a silicon diode element hermetically sealed within the enclosure defined by said base said cylinder and said cap with one electrode seated on said base, and means to connect the other electrode to said cap, the combination comprising a first low expansion coefficient metal washer between said cylinder and said base, a second low expansion coefficient metal washer between said cylinder and said cap both for reducing stresses on said cylinder due to temperature variation, said cap being a circular disc with a centrally located raised stop and cylindrical accordian pleated bellows, secured to said disc for making elastic contact in a mounting for said diode assembly, said stop being of a dimension to prevent compression of said bellows beyond its elastic limits.

2. A microwave diode assembly comprising an electronic semiconductor member having a first electrode region and a second electrode region, a mounting base of metal exhibiting high thermal conductivity having at one side a pedestal affixed to said first region and providing a first electrode for said assembly, a hollow dielectric member having two open ends mounted at one of said ends on said one side of said mounting base surrounding but spaced from said pedestal and semiconductor member, a second electrode member of resilient metal electrically connected to said second electrode region and having a plurality of flexible arms extending and affixed at their ends to a plurality of respective regions on the periphery of the other open end of said dielectric member, and electrically conductive contact means affixed to said periphery in electrical contact with at least one of said flexible arm ends and providing a second electrode for said assembly, said contact means being a circular disc with a stop member protruding from it away from said semiconductor member and having a resilient hollow electrically conductive sleeve mounted on said disc surrounding and spaced from the stop member and extending beyond the stop member for making elastic mechanical contact to an electrical connection to said second electrode region, the dimensions of said stop member and sleeve being so proportioned relative to the resilience of said sleeve that if said sleeve is compressed in said contact said stop will be contacted before said sleeve is compressed beyond its elastic limit.

3. In a microwave diode assembly, a base and a cap of electrically conductive material, and a hollow dielectric tube between said base and cap rigidly attached to both and forming with them a hollow housing, a semiconductor element having at least two electrode regions within the housing with one electrode region seated on said base and means resiliently to connect a second electrode region electrically to said cap, said cap having outside said housing a stop member protruding away from said housing, and overlying and extending beyond said stop member a resilient electric conductor for making elastic mechanical contact to an electrical connection to said second electrode region, the dimensions of said stop member and resilient conductor being so proportional relative to the resilience of said conductor that if said conductor is compressed in said contact said stop will be contacted before said conductor is compressed beyond its elastic limit.

References Cited

UNITED STATES PATENTS

| | | | |
|---|---|---|---|
| 3,030,557 | 4/1962 | Dermit | 317—234 |
| 3,248,681 | 4/1966 | Reintgen | 317—234 |
| 3,378,407 | 4/1968 | Keys | 317—235 |
| 2,676,274 | 4/1954 | Kobayashi | 317—234 |
| 2,897,419 | 7/1959 | Howland et al. | |
| 2,921,245 | 1/1960 | Wallace et al. | |
| 3,261,075 | 7/1966 | Carman. | |
| 3,293,509 | 12/1966 | Emeis. | |
| 3,300,841 | 1/1967 | Fisher et al. | 317—234 |
| 3,328,650 | 6/1967 | Boyer. | |

FOREIGN PATENTS

| | | |
|---|---|---|
| 834,000 | 5/1960 | Great Britain. |
| 837,534 | 4/1952 | Germany. |
| 1,108,663 | 1/1956 | France. |
| 926,441 | 5/1963 | Great Britain. |

JOHN W. HUCKERT, Primary Examiner

J. D. CRAIG, Assistant Examiner

U.S. Cl. X.R.

174—52